United States Patent [19]

Talbot

[11] Patent Number: 4,689,581
[45] Date of Patent: Aug. 25, 1987

[54] INTEGRATED CIRCUIT PHASE LOCKED LOOP TIMING APPARATUS

[75] Inventor: Gerald R. Talbot, Bristol, United Kingdom

[73] Assignee: Inmos Limited, Bristol, United Kingdom

[21] Appl. No.: 756,434
[22] PCT Filed: Nov. 2, 1984
[86] PCT No.: PCT/GB84/00375
§ 371 Date: Jul. 3, 1985
§ 102(e) Date: Jul. 3, 1985
[87] PCT Pub. No.: WO85/02076
PCT Pub. Date: May 9, 1985

[30] Foreign Application Priority Data
Nov. 4, 1983 [GB] United Kingdom ............... 8329511

[51] Int. Cl.$^4$ .......................... H03L 7/08; H03L 7/18
[52] U.S. Cl. .......................... 331/1 A; 331/8; 331/17; 331/25; 331/34; 331/111; 331/113 R
[58] Field of Search .................. 331/1 A, 8, 17, 25, 331/34; 357/51

[56] References Cited

U.S. PATENT DOCUMENTS

| | | | |
|---|---|---|---|
| 3,930,304 | 1/1976 | Keller et al. | 357/51 X |
| 4,034,309 | 7/1977 | Vaughn | 331/1 A |
| 4,093,873 | 6/1978 | Vannier et al. | 331/51 X |
| 4,141,209 | 2/1979 | Barnett et al. | 357/51 X |
| 4,210,875 | 7/1980 | Beasom | 330/277 |
| 4,494,021 | 1/1985 | Bell et al. | 331/25 X |
| 4,524,333 | 6/1985 | Iwata et al. | 331/25 X |

OTHER PUBLICATIONS

Brooks et al, "High Capacity Electronics System for a Compact, Battery-Operated Computer," Hewlett-Packard Journal, vol. 34, No. 6, Jun. 1983, pp. 10–15.

Primary Examiner—Siegfried H. Grimm
Attorney, Agent, or Firm—Edward D. Manzo

[57] ABSTRACT

An integrated circuit device includes a timing apparatus arranged to produce timing signals whose frequency is a multiple of that of a clock signal. The timing apparatus, which includes a phase locked loop, is formed on a single chip and no external components are necessary. The phase locked loop includes a convertor and filter circuit (11), the convertor (14) including two transistor current sources (19,24) whose current magnitude is determined by a current reference circuit (13) including current mirror transistors (28, 31). The current sources (19, 24) are controlled by increase and decrease output signals from a phase and frequency comparator (7) such that the output of the convertor (14) depends upon the mark space ratio of the comparator output signals. The output of the convertor (14) is filtered and then fed as a control voltage to a voltage controlled oscillator (12). The oscillator output is fed by way of a divider to the phase comparator (7) and also provides the high frequency input timing signal for a logic device, such as a microcomputer (2). As the timing apparatus is fabricated using MOS technology, it is not possible to forecast its performance accurately. Surprisingly, it has been found that the timing apparatus of the invention is capable of exhibiting closed loop stability without further trimming. However, to ensure that such closed loop stability can always be obtained, additional components, for varying the parameters of the circuits may be provided, said components being connectible into the circuit by programmable switches, such as laser fuses (as 33, 42).

24 Claims, 4 Drawing Figures

INTEGRATED CIRCUIT PHASE LOCKED LOOP TIMING APPARATUS

The present invention relates to a timing apparatus for generating timing pulses.

For example, the timing pulses generated may be used for a microcomputer of the type described in our co-pending UK patent application No. 8233733 filed Nov. 26, 1982 or of the type described in our co-pending European patent application No. 83307078.2 filed Nov. 18, 1983.

The MOS technology processes used to manufacture microprocessors result in devices which are similar, but of varying performance. It is normal practice to measure the maximum operating speed of such devices after they have been manufactured, and it is found that the operating speed of the devices differ. The fast devices should be used with high frequency clock signals such that full advantage is taken of their potential to operate at high speeds, but the slower devices require a low frequency clock input. Thus, if the clock signals are to be matched to the operating speed of the manufactured devices it is currently necessary to provide an external clock of suitable speed once the performance of the microprocessor has been determined.

Furthermore, it is difficult to generate and distribute high frequency clock signals, and presently this imposes a real and practical limitation to the operating speed of current microprocessors and microcomputers.

Phase locked loops have been used for many years to construct frequency multipliers, and in recent times integrated circuit phase locked loops have been provided. However, the components of a phase locked loop are not easy to manufacture be existing integrated circuit manufacturing techniques such that existing integrated circuit phase locked loops require additional components external to the integrated circuit.

According to the present invention there is provided a timing apparatus including a control loop circuit and arranged upon receipt of a clock signal to produce a timing signal whose frequency is a multiple of that of said clock signal, said timing apparatus being formed on a single chip.

The present invention also extends to an integrated circuit timing apparatus comprising a phase locked loop arranged to produce an output timing signal whose frequency is a multiple of that of an input clock signal, wherein said phase locked loop comprises a voltage controlled oscillator and means for generating a voltage signal for controlling said oscillator, said generating means comprising one or more current sources.

According to a further aspect of the invention there is provided an integrated circuit device comprising a logic device connected to input and output pins, and a timing apparatus as defined above, an input of the timing apparatus being connected to one of the input pins for receipt of the clock signal, and an output of said timing apparatus being connected to said logic device to supply timing signals thereto.

Preferably, said logic device is a microcomputer.

The present invention also extends to a method of supplying timing signals to an integrated circuit logic device comprising applying a low frequency clock signal to an input of said integrated circuit, including in said integrated circuit a timing apparatus for receiving said clock signal and producing a timing signal having a frequency which is a multiple of that of said clock signal, and applying said high frequency timing frequency to said logic device.

Preferably, the operating speed of said logic device is determined and the frequency of the timing signal is matched to said operating speed.

The present invention also provides timing apparatus arranged to produce clock pulses, which timing apparatus includes a loop circuit incorporating a voltage controlled oscillator, the output signal being a multiple of the frequency of the input signal, said voltage controlled oscillator being responsive to the operation of one or more current sources, the operation of the current sources being adjustable to modify the output frequency.

The aforesaid modification of the current sources may be achieved by laser fusing techniques.

The aforesaid current sources may include integrated circuits and the modification of the current sources may be effected by a variety of techniques which make or break connections in said integrated circuits. These may incorporate laser fuses, electrically blown fuses, non-volatile storage elements or laser anti-fuses.

The invention includes a computer device, which may for example consist of a microcomputer, in combination with timing apparatus as aforesaid for generating clock pulses for use by the computing apparatus.

The invention also includes a network of computer devices in which clock pulses are produced by timing apparatus as aforesaid.

Embodiments of the present invention will hereinafter by described, by way of example, with reference to the accompanying drawings, in which.

Figure 1:
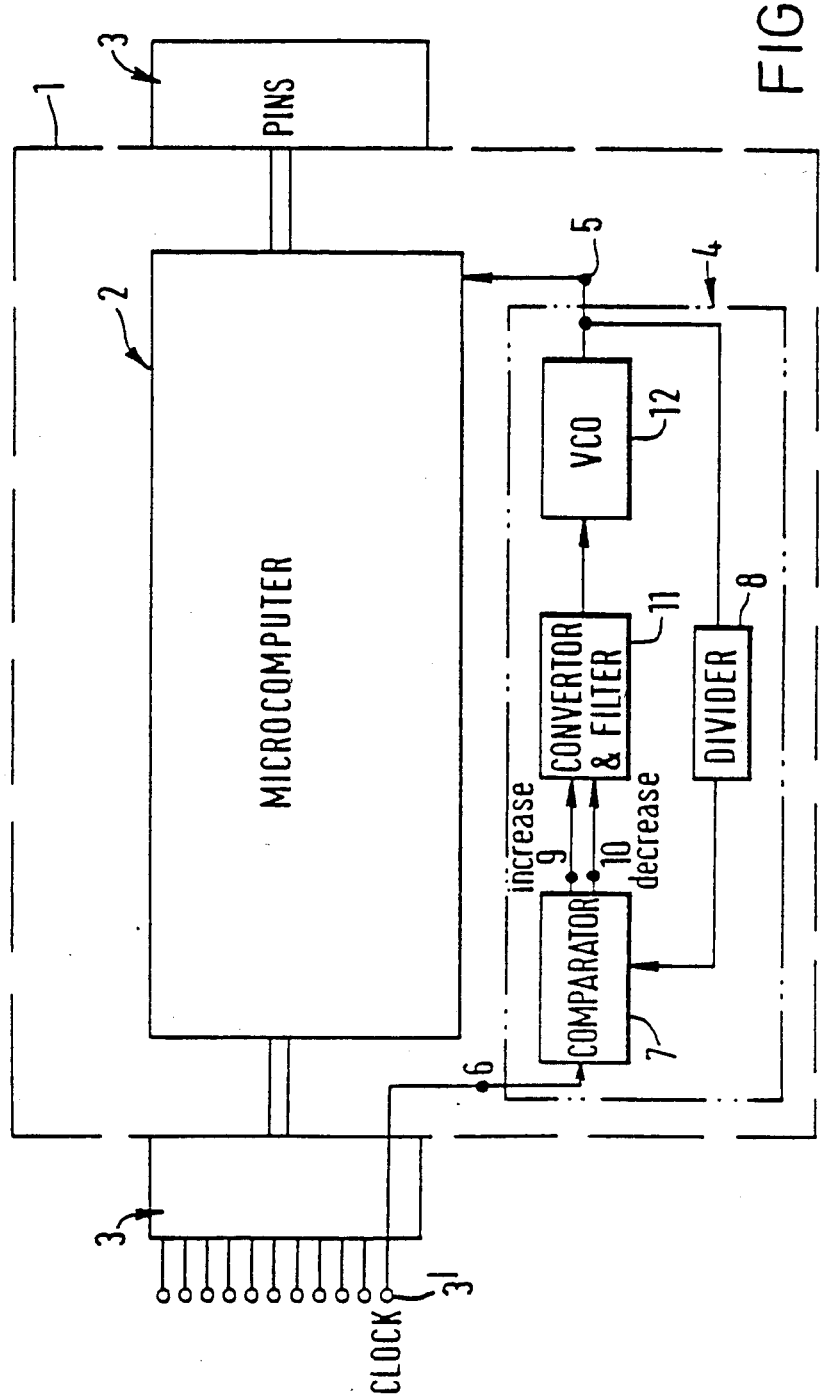
FIG. 1 shows schematically an integrated circuit device including timing apparatus of the present invention.

FIG. 1 shows an integrated circuit device fabricated using complementary MOS technology on a single silicon chip 1. The integrated circuit device includes a logic device 2 connected to input and output pins 3.

In the embodiment illustrated, the logic device 2 is shown to be a microcomputer, and, for example, could be a microcomputer of the type described in our co-pending European Patent application No. 83307078.2 filed Nov. 18, 1983 which is fabricated on a single silicon chip.

However, the logic device 2 can be any circuit capable of performing logic operations which requires timing signals. Thus, the logic device 2 could be a processor, a central processing unit, an arithmetic logic unit and the like.

The integrated circuit device of FIG. 1 also includes timing apparatus, generally indicated by the reference numeral 4, arranged to receive an external clock signal applied to one of the pins 3' and to generate a timing signal at an output 5 for application to the logic device 2.

The timing appartus 4 includes a control or closed loop circuit and is arranged to provide at its output 5 a timing signal whose frequency is a multiple of the frequency of the clock signal fed to its input 6 by way of the pin 3'.

As is clear from FIG. 1, all of the components of the timing apparatus 4 are on the single silicon chip and the timing apparatus 4 has been designed such that it does not require any components external to the chip 1.

The basic structure of the control loop circuit of the timing apparatus 4 is apparent from FIG. 1 and it will be seen that it is constituted by a phase locked loop. The clock signal applied to the pin 3' is connected by way of the input 6 to a digital phase and frequency comparator 7 which is arranged to compare the input clock signal with a further signal fed back from the output 5 by way of a divider 8.

If the phase or frequency of the signal fed by the divider 8 to the comparator 7 differs from the input clock signal the comparator 7 is arranged to produce appropriate output signals. In this respect, if the frequency of the input signal from the divider 8 is lower than that of the clock signal the comparator 7 will produce an increase output signal on its output 9 to indicate that the frequency is to be increased. Similarly, if the frequency of the signal fed by the divider 8 to the comparator 7 is higher than that of the clock signal the comparator will produce a decrease output signal at its output 10 to signify that the frequency of the output signal has to be decreased.

The output signals from the comparator 7 on the outputs 9 and 10 are a series of pulses which are fed to a convertor and filter circuit 11 which is arranged to convert the output pulses from the comparator 7 into a voltage signal for controlling the frequency of oscillation of a voltage controlled oscillator circuit 12. In this respect, it is the amplitude of the voltage signal applied to the oscillator circuit 12 which determines the frequency of the oscillations and hence the frequency of the signal appearing at the output 5 of the timing apparatus 4.

As described above, the high frequency output signal appearing at the output of the voltage controlled oscillator 12 is fed back by way of the divider 8 to the phase comparator 7. The divider 8 is arranged to divide the frequency of the signal at its input by a predetermined integer N. It will thus be apparent that the phase locked loop will function to produce at its output 5 a signal whose frequency is N times the frequency of the clock signal applied to its input 6.

Generally, the comparator 7 will compare the frequency of its two input signals. However, when the phase locked loop has operated to make these frequencies substantially identical, the comparator 7 will compare the phases of the two input signals to accurately lock the loop.

Preferably, the divider 8 is programmable such that the value of the divider integer N may be varied as required. This can be done, for example, by providing connections in the divider circuit which can be made or broken as required. Thus, laser fuses, electrically blown fuses, non-volatile storage elements and/or laser anti-fuses could be provided in the divider circuit 8.

It is known to use a phase locked loop to construct a frequency multiplier in which the frequency of the output signal is a multiple of the frequency of the input signal and in this respect, the basic operation of the phase locked loop shown in FIG. 1 will be clear to anyone skilled in the art and is not further described herein.

For closed loop stability it can be shown that the Bode plot of the frequency response of the open loop should have a positive phase margin when the logarithm of the gain is zero. The frequency response of the open loop is dependent upon both the centre frequency of the voltage controlled oscillator circuit 12 and the transfer function of the convertor and filter circuit 11.

MOS manufacturing processes do not permit the physical properties of components of the integrated circuit to be sufficiently accurately controlled and thus using MOS technology it is not possible to determine in advance the centre frequency of the oscillations and the transfer function of the filter circuit. Thus, existing integrated circuit phase locked loops are provided with additional components external to the integrated circuit. Generally, these external components include filtering circuits and circuits for determining the centre frequency of the oscillator, these circuits being chosen to have characteristics which correspond to the measured responses of the integrated circuit once it has been fabricated.

The integrated circuit phase locked loop of the present invention has been designed such that all of its components can be manufactured using an MOS manufacturing process and such that external components are not required to provide closed loop stability.

Originally, the inventors designed the phase locked loop to include optional and alternative components connectible into the loop by way of fuses such that manufacturing variations could be compensated. Surprisingly, they found that the design of the convertor and filter circuit and of the voltage controlled oscillator means that in many cases trimming of the phase locked loop was not necessary. Accordingly, in many practical cases, it is only necessary to provide for variation of the divider integer N of the divider 8 such that the frequency of the output signal can be chosen as is required.

Figure 2:
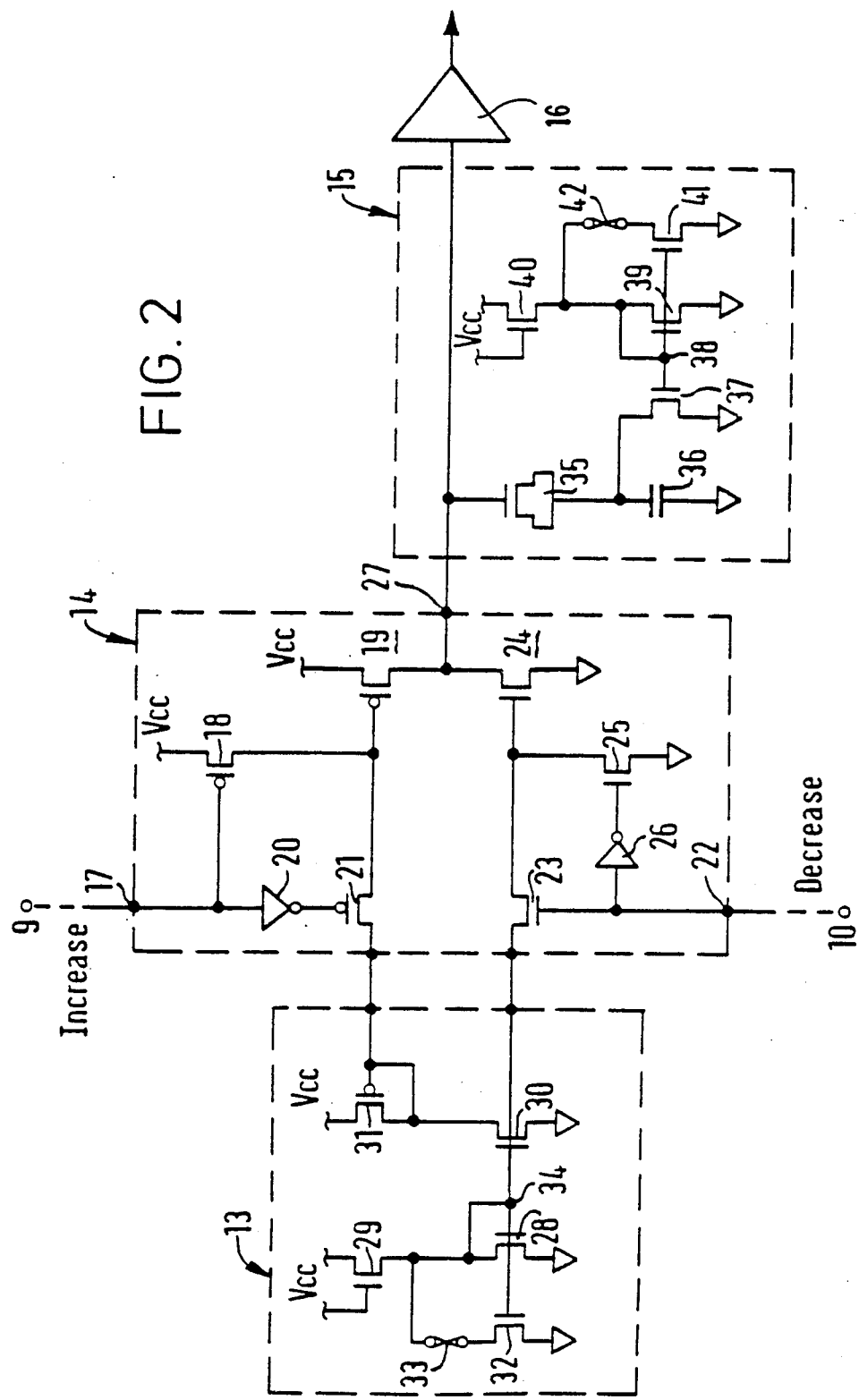
FIG. 2 shows an embodiment of a convertor and filter circuit of the timing apparatus of FIG. 1.

The convertor and filter circuit 1 of the phase locked loop is shown in FIG. 2 and is connected to receive both the increase output signal 9 and the decrease output signal 10 from the comparator 7. In this respect, each of the output signals from the comparator consists of a stream of pulses whose mark space ratio is proportional to the difference in frequency or phase identified by the comparator 7. The circuit 11 has the function of converting these streams of pulses into a DC voltage whose amplitude controls the voltage controlled oscillator 12. In addition, it is this circuit 11 which ensures the stability of the phase locked loop in that its transfer function is arranged to ensure that the loop has a positive phase margin at zero gain.

The circuit shown in FIG. 2 comprises a programmable current reference circuit 13, a pulse to voltage convertor circuit 14, a filter circuit 15, and an output buffer 16 for feeding the output signal to the voltage controlled oscillator circuit 12.

The increase signal from output 9 is fed to a first input 17 of the convertor 14 and is applied by way of a P channel transistor 18 to the gate of a further P channel transistor 19 which acts as a current source and whose source is connected to the voltage supply Vcc. The increase signal is also fed by way of an inverter 20 and a further P channel transistor 21 to the gate of the current source transistor 19. It will be appreciated that when negative going pulses of the increase signal are applied to the gate of the transistor 18, this transistor 18 will conduct and render the current source transistor 19 non-conductive. Positive going pulses of the increase signal when inverted by the inverter 20 and applied to the gate of the transistor 21 will cause the transistor 21 to conduct and apply negative pulses to the gate of the transistor 19 which will thus be rendered conductive. The magnitude of the current flow from the current source transistor 19 will be determined by the magnitude of the voltage applied to its gate and thus by the current reference circuit 13 as is described below.

The decrease output signal from comparator output 10 is applied to an input terminal 22 of the convertor circuit 14 and then to the gate of an N channel transistor 23 whose source-drain path is connected to the gate of an N channel transistor 24 which is also arranged to act as a current source, and whose source is connected to ground. The gate of the current source transistor 24 is also connected to the source-drain path of a further N channel transistor 25 whose gate is connected by way of an inverter 26 to the input terminal 22.

Negative going pulses applied to the input terminal 22 are inverted by inverter 26 such that the positive pulses applied to the gate of the transistor 25 render this transistor conductive and hence the current source transistor 24 non-conductive. The positive going pulses of the decrease signal will be effective to render the transistor 23 and hence the current source transistor 24 conductive and again the magnitude of the current flow will be determined by the voltage applied to the gate of the transistor 24.

The current source transistor 19 will thus be controlled by the increase signal to produce positive sense current pulses at an output 27 whilst the current source transistor 24 will be controlled by the decrease signal to produce negative sense current pulses at the output 27. It is required that the magnitude of the current produced at the output 27 by the transistor 19 in response to the application of a voltage of a predetermined magnitude at its gate be identical to that produced by the transistor 24 in response to the application of a voltage of the same predetermined magnitude at its gate. The magnitude of the current produced by each of the transistor current sources 19 and 24 is determined by way of the programmable current reference circuit 13 which utilizes current mirrors.

The programmable current reference circuit 13 includes an N channel current mirror provided by a transistor 28 whose width to length ratio is substantially the same as that of the current source transistor 24. The gates of the transistors 24 and 28 are connected together. The gate 34 of the current mirror transistor 28 is also connected to its drain and by way of a further N channel transistor 29 to the voltage supply Vcc. The resistance of the transistor 29 determines the source-drain current of the transistor 28 and hence the voltage which appears on its gate 34. The gate voltage of the current mirror transistor 28 acts as a reference voltage which is applied to the gate of the transistor 24 to determine the current flowing therethrough. In this instance, as the transistors 24 and 28 have the same width to length ratio, the currents flowing through the transistors 24 and 28 will be the same.

The reference voltage appearing at the gate 34 of the transistor 28 and determining the current through the current source transistor 24 is also applied to the gate of a further N channel transistor 30 whose source-drain path is connected by way of a P channel transistor 31 to the voltage source Vcc. The width to length ratio of the transistors 28 and 30 is the same such that the current flowing through the transistors 30 and 31 will be the same as that flowing in the transistor 24.

The P channel transistor 31 is in fact a current mirror for the P channel current source transistor 19 of the convertor circuit 14. It will be seen that the gate of the P channel transistor 31 is connected to its drain such that the flow of current through the transistor 31 puts a voltage on its gate which is also applied to the gate of the transistor 19, and as the width to length ratios of the transistors 19 and 31 are the same, the current flowing through the transistor 19 will have the same magnitude as that flowing through transistor 31. Hence, it will be apparent that the reference circuit 13 is operative to generate a predetermined reference voltage which is arranged to ensure that both of the current source transistors 19 and 24 provide a current of equal magnitude.

Of course, the transistors 19 and 24, acting as current sources, are controlled by the application of the increase and decrease signal pulses applied to the input terminals 17 and 22.

The magnitude of the current output from the current source transistors 19 and 24 is determined by the value of the reference voltage and this in turn depends upon the width to length ratios of the transistors 28 and 29. Clearly, the gains of the transistors 28 and 29 can be chosen as required and means can be provided for altering the gain if the CMOS circuit as manufactured does not provide the required circuit parameters.

Thus, in the embodiment illustrated in FIG. 2, a further N channel transistor 32 is shown and its source-drain path is connected, by way of a programmable switch 33, in series with the source-drain path of the transistor 29. In the embodiment shown, this programmable switch is a normally closed fuse 33 which can be blown, for example, by laser. In the embodiment illustrated, with the fuse 33 normally closed, the gain exhibited by the transistor 28 is determined both by its width to length ratio and by that of the transistor 32. Thus, the value of the reference voltage at gate 34 can be changed by blowing the fuse 33 to form an open circuit. If required, further transistors as 32 with appropriate fuse links as 33 can be provided.

The voltage convertor circuit 14 provides at its output 27 a plurality of positive and negative going current pulses whose magnitude is determined by the current reference circuit 13 but whose presence and frequency are controlled by the incoming increase signal pulses at input 17 and decrease signal pulses at input 22. The convertor and filter circuit 11 incorporates the filter 15 at whose output a voltage signal for controlling the voltage controlled oscillator circuit 12 is provided.

The filter circuit 15 is a low pass lead/lag filter also incorporated by CMOS techniques in the integrated circuit. It will be seen that this filter circuit 15 includes a MOS capacitor 35 which is connected between the output 27 of the convertor and ground by way of a capacitor 36. In addition, the MOS capacitor 35 is connected to ground by way of the source-drain path of a transistor 37. The transistor 37 is an N channel transistor biased by way of the control voltage appearing on its gate 38 to operate as a resistor and thereby form with the MOS capacitor 35 an RC filter. The control voltage at the gate 38 is determined by way of a current mirror incorporating an N channel transistor 39 connected to Vcc by way of a further N channel transistor 40. The control voltage at the gate 38 which determines that the transistor 37 functions as a resistor depends upon the width to length ratios of the transistors 39 and 40.

Clearly, the characteristics of the filter circuit 15 can be altered as required by altering the gains of the transistors 39 and 40. For example, and as illustrated, a further N channel transistor 41 can have its source-drain path connected by way of a programmable switch such as a fuse 42, to the source-drain path of the transistor 40. It would be intended that the fuse 42 be normally closed upon manufacture such that the gain exhibited by the transistor 39 would be determined both by its width to length ratio and by that of the transistor 41. Blowing of the fuse 42 would render it open circuit and alter the control voltage at gate 38.

The voltage output signal from the filter circuit 15 is a DC voltage whose magnitude is determined by the mark space ratios of the input signals fed to the convertor 14 at inputs 17 and 22. Thus, the application of an increase signal pulse causes an increase in the voltage output of the filter whereas the application of a decrease signal pulse causes the voltage to be decreased.

The output voltage from the filter circuit 15 is fed by way of a buffer circuit 16 which provides a low impedance drive circuit for the voltage controlled oscillator and also includes a filter to smooth out ripples in the output of the filter circuit 15.

Figure 3:
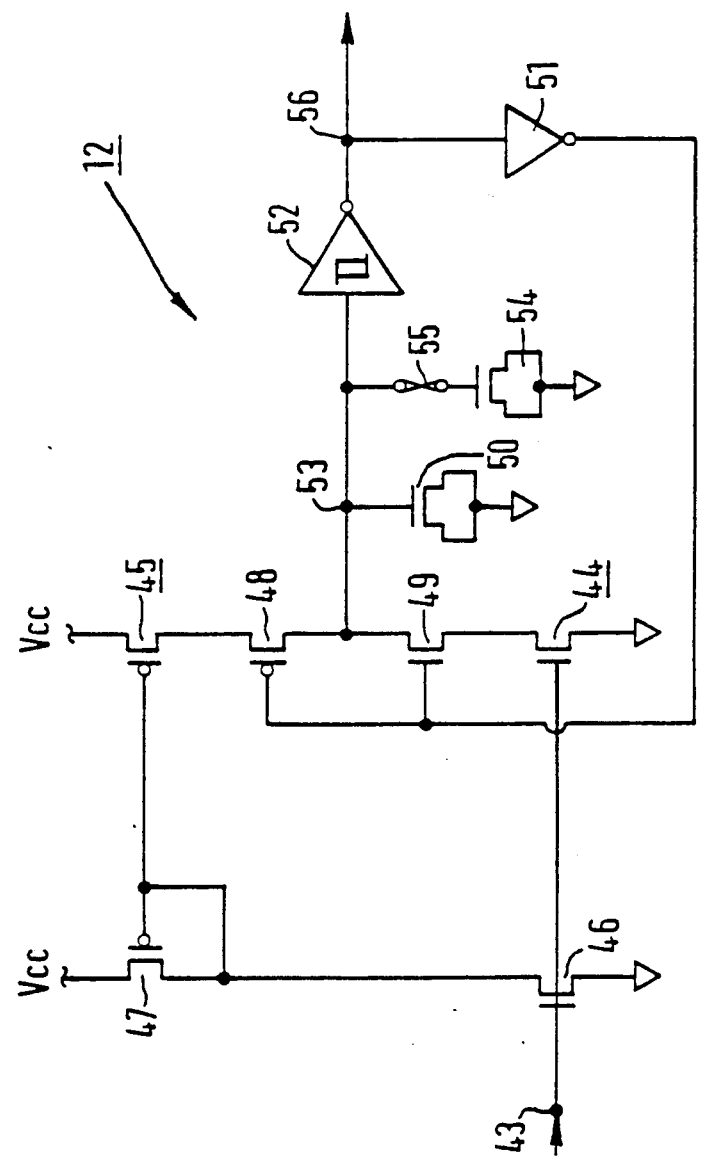
FIG. 3 shows a circuit diagram of one embodiment of a voltage controlled oscillator circuit of the timing apparatus of Figure 1.

The frequency of oscillation of the frequency controlled oscillator 12 is determined by the magnitude of the voltage signal fed thereto as indicated earlier. A first embodiment of the voltage controlled oscillator circuit 12 is illustrated in FIG. 3.

The voltage output from the buffer 16 is fed to an input terminal 43 of the voltage controlled oscillator circuit and is arranged to control the current flowing through an N channel transistor 44 acting as a current source and a P channel transistor 45 which also acts as a current source. The control voltage at input 43 is connected directly to the gate of the N channel transistor 44 such that it directly determines the current flowing through this transistor 44. The same current is arranged to be generated in the P channel transistor 45 by the use of current mirrors. Thus, the control voltage at input terminal 43 is also applied to the gate of a further N channel transistor 46 having the same width to length ratio as the transistor 44 such that the same current is arranged to flow in both transistors 44 and 46. The source-drain path of the transistor 46 is connected in series with the source-drain path of a P channel transistor 47 whose drain is connected to its gate. The gate voltage of the P channel transistor 47 is applied to the gate of the current source transistor 45 to induce a current therein. It will be appreciated that when a predetermined voltage is applied to the input 43, both current source transistors 44 and 45 will produce a current of the same magnitude.

The P channel transistor 45 is connected by way of a further P channel transistor 48 to a node 53 connected to one terminal of a MOS capacitor 50. Similarly, the current source transistor 44 is connected to the node 53 by way of an N channel transistor 49. The transistors 48 and 49 are arranged to act as switches.

The gates of the two switching transistors 48 and 49 are each connected by way of an inverter 51 to the output of a Schmitt trigger 52. The input of the Schmitt trigger 52 is also connected to the node 53.

Let us assume initially that the transistor switch 48 is ON such that the current supplied by the transistor current source 45, and determined by the magnitude of the voltage at input 43, flows to charge the MOS capacitor 50. The voltage on the gate of the switch 48 from the inverter 51 will be low and able to maintain the transistor 48 ON and at the same time will hold the transistor 49 OFF. The output from the Schmitt trigger 52 will be high and initially the input to the Schmitt trigger 52 will be low. However, the current flowing into the capacitor 50 from the current source 45 will increase the voltage at the node 53 and eventually will attain a trigger voltage for the Schmitt trigger 52 such that the output state of the Schmitt trigger 52 will change from high to low. A high level voltage will then be applied by the inverter 51 to the gates of the transistors 49 and 48 switching the transistor 48 OFF and thereby curtailing the charging of the capacitor 50. The transistor switch 49 will be switched ON such that the transistor 49 and the current source transistor 44 will provide a discharge path for the capacitor 50. The magnitude of the discharge current through the transistor 44 will be determined by the magnitude of the voltage at the input terminal 43. Of course, as the capacitor 50 discharges the voltage at the node 53 will fall and when it reaches the other trigger value for the Schmitt trigger 52, the output of the Schmitt trigger will again change state. Thus, an oscillating output signal will be provided at the output 56 of the voltage controlled oscillator circuit and the oscillation will be sustained.

The frequency of the oscillation will depend upon the capacitance of the MOS capacior 50 and upon the value of the current flowing through the current sources 44 and 45 which is of course dependent upon the magnitude of the input voltage at input 43. As the input voltage increases so does the magnitude of the current flow and hence the speed with which the capacitor is charged and discharged.

To make it possible for the oscillator circuit 12 to have the required centre frequency to meet the needs of the overall phase locked loop, one or more additional MOS capacitors as 54 may be provided as shown and connected to the node 53 by way of a respective programmable switch, such as a fuse 55. Initially, the or each fuse 55 would be closed, but if trimming of the circuit was necessary one or more of the fuses could be blown to provide an open circuit and thereby disconnect the respective capacitor 54 from the node 53. Clearly, this would vary the time constant of the capactivie circuit and hence vary the frequency of oscillations. Additionally, to enable variation of the current levels in the current sources 44 and 45, it would be possible to connect additional transistors (not shown) in parallel with the current sources 44 and 45 such that the effective gains of these transistors could be varied. It is envisaged that any such transistors would be connected in circuit by way of programmable switches, such as fuses.

It is intended that the output of the oscillator circuit shown in FIG. 3 be used as a high frequency clock signal, for example for a processor or microcomputer. In these circumstances it is generally necessary to provide at least two clock signals of complementary phase which do not overlap. Thus, the output of the oscillator circuit shown in FIG. 3 could be applied by way of a two phase clock generator (not shown) to the microcomputer 2 (FIG. 1).

Figure 4:
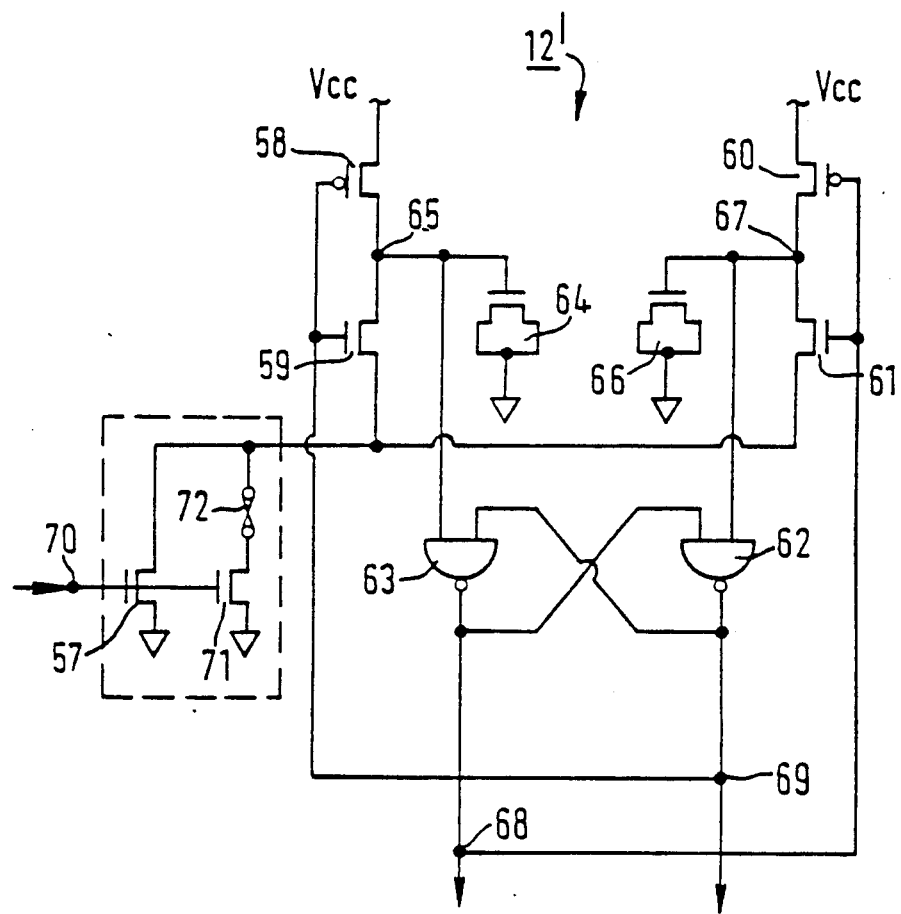
FIG. 4 shows a further embodiment of a voltage controlled oscillator circuit of the timing apparatus.

FIG. 4 shows an alternative embodiment of a voltage controlled oscillator circuit 12' which provides two oscillating output signals which are complementary in phase and which require only a minimum shaping before they can be applied to the microcomputer.

The voltage controlled oscillator circuit 12' shown in FIG. 4 has an input terminal 70 to which the voltage output from the buffer 16 is applied. The circuit 12' includes a voltage controlled current source in the form of an N channel transistor 57 whose gate is connected to the input terminal 70. Thus, the current flowing in the transistor 57 is determined by the magnitude of the voltage applied to the input terminal 70. The source-drain path of the transistor 57 is connected in series with a first series connection of a P channel transistor 58 and an N channel transistor 59 and with a second series connection of a P channel transistor 60 and an N channel transistor 61. It will be appreciated that the current flowing through each pair of transistors 58, 59, and 60, 61 will be determined by that flowing through the N channel current source transistor 57.

The gates of the first pair of transistors 58 and 59 are connected together and to the output of a NAND gate 62. Similarly, the gates of the second pair of transistors 60 and 61 are connected together and to the output of a further NAND gate 63. A first input of each NAND gate is connected to a respective MOS capacitor. Thus, the first input of NAND gate 63 is connected to a node 65 connecting the drain of transistor 58 to the source of transistor 59, the node 65 also being connected to a MOS capacitor 64. The second input of the NAND gate 63 is connected to the output of the NAND gate 62.

Similarly, a first input to the NAND gate 62 is connected to a node 67 at which the transistors 60 and 61 are connected, the node 67 also being connected to a MOS capacitor 66. The second input to the NAND gate 62 is connected to the output of the NAND gate 63. It will also be seen that the output of the NAND gate 63 is connected to a first output terminal 68 whilst the output of the NAND gate 62 is connected to a second output terminal 69.

Consider initially that there is a low level voltage at the output of the NAND gate 62 which is applied to the second input of the NAND gate 63 and by way of the output 69 to the gates of the transistors 58 and 59. The P-channel transistor 58 will therefore conduct and begin to charge the capacitor 64. Initially there will be a low level voltage on the first input to the NAND gate 63.

The high level output of the NAND gate 63 is applied to the second input of the NAND gate 62 and by way of the output 68 to the transistors 60 and 61.

As the capacitor 64 is charged the first input to the NAND gate 63 will become high but the output of the NAND gate 63 will remain high.

The high output at the terminal 68 switches on the N channel transistor 61 and switches OFF the P channel transistor 60 such that the capacitor 66 is discharged by way of the transistor 61 and the current source transistor 57. A low going voltage is therefore applied to the first input to the NAND gate 62 whilst the high voltage is already applied to the second input. As the first input of NAND gate 62 goes from high to low its output switches from low to high such that the transistor 58 is switched OFF and the transistor 59 is switched ON such that discharging of the capacitor 64 is commenced by way of the current source transistor 57.

The high level output of the NAND gate 62 is fed to the second input of the NAND gate 63. As this NAND gate 63 also has a high applied to its first input, its output will go from high to low. The P channel transistor 60 will thereby be switched ON and the N channel transistor 61 will be rendered non-conductive such that charging of the capacitor 66 will be commenced. Of course, once the discharge of the capacitor 64 puts a low on the first input of the NAND gate 63 the output state thereof will change and the state of the NAND gate 62 will similarly be changed.

It will be seen that an oscillating signal will be generated on each of the outputs 68 and 69. The speed of the discharge of the capacitors 64 and 66 is determined by the magnitude of the current flow through the current source transistor 57 and hence upon the magnitude of the input voltage at input 70. Thus, the frequency of the oscillations at each output terminal 68 and 69 is determined by the magnitude of the input voltage.

The capacitor 64 is generally being charged as the capacitor 66 is being discharged and vice versa. Thus, the output signals at terminals 68 and 69 are substantially 180° out of phase. There may be some overlap between the leading edge of one output signal and the trailing edge of the other, but this can be removed if required by shaping one or both of the output waveforms.

The centre frequency of the oscillator 12' can be changed as previously by connecting one or more transistors, as 71 into the circuit by way of respective fuses, as 72.

It will be appreciated that initialisation of the oscillators 12 and 12' shown in FIGS. 3 and 4 may well be necessary. However, as initialisation techniques are well known, details thereof will not be described.

It will be seen from the description given above that the timing apparatus described including the phase locked loop is able to provide high frequency timing signals upon the application of a low frequency clock to the input thereof.

It thus becomes possible to supply a microcomputer incorporating apparatus on the same chip the timing as shown in FIG. 1. The user than needs only to connect the clock input pin 3' to a standard low frequency clock signal, at say 5 MHZ, to obtain operation of the microcomputer at high operating speeds. Thus, it would be envisaged that the timing apparatus would generate timing signals having a frequency, eg, of the order of 40–100 MHZ. Furthermore, the user could use the same low frequency standard clock for a number of or a network of such microcomputers, the individual timing apparatus associated with each microcomputer providing suitable high frequency timing signals for its microcomputer.

Of course, the timing apparatus of the invention is not limited to use with microcomputers, but can be used to provide timing signals for any logic device.

I claim:

1. An integrated circuit device comprising a logic device, a plurality of input pins connected to said logic device, a plurality of output pins connected to said logic device, and a timing apparatus for said logic device having an input connected to one of said input pins for receiving an input clock signal and an output connected to supply an output timing signal to said logic device, wherein both said logic device and said timing apparatus are completely formed on a common single chip, said timing apparatus comprising a phase locked loop arranged to produce said output timing signal whose frequency is a multiple of that of said received input clock signal, wherein said phase locked loop comprises:

comparator means having a first input to which said received input clock signal is applied, a second input, and two outputs on which comparison signals are provided;

a divider having an input connected to receive said output timing signal and an output connected to said second input of said comparator means, said divider being arranged to divide the frequency of said output timing signal by a predetermined integer;

convertor and filter means connected to receive said comparison signals and arranged to generate a voltage signal whose magnitude is determined by said comparison signals; and a voltage controlled oscillator arranged to be controlled by said voltage signal to produce said output timing signal at its output, the output of said voltage controlled oscillator being connected to said input of said divider, and wherein the output of said voltage controlled oscillator is also directly connected to said logic device to supply said output timing signal thereto.

2. An integrated circuit device according to claim 1 wherein said comparator means is a phase and frequency comparator and is arranged to produce first and second comparison output signals indicating a difference in either phase or frequency between the input clock signal and the divided output timing signal and the direction of this difference.

3. An integrated circuit device according to claim 2 wherein said convertor and filter means comprises at least one current source arranged to be controlled by said comparison signals and a current reference circuit arranged to determine the magnitude of the current produced by said current source.

4. An integrated circuit device according to claim 3 wherein said convertor and filter means comprises first and second current sources, said first current source being controlled by said first comparison signal, said second current source being controlled by said second comparison signal, each of said first and second current sources comprising a transistor and wherein said current reference circuit includes first and second current mirror transistors, each corresponding to a respective one of said first and second current source transistors, each current mirror transistor being arranged to determine the magnitude of the current produced by its corresponding current source transistor.

5. An integrated circuit device according to claim 4 wherein said current reference circuit is arranged to generate a predetermined reference voltage for determining the current flowing in each of the first and second current mirror transistors and hence in each of the first and second current source transistors.

6. An integrated circuit device according to claim 5 wherein said predetermined reference voltage is generated at a node connectible to the voltage supply by way of a circuit for determining said predetermined reference voltage, said circuit including a plurality of components connectible by programmable switches.

7. An integrated circuit device according to claim 6 wherein said programmable switches are fuses.

8. An integrated circuit device according to claim 1 wherein said convertor and filter means comprises a convertor coupled to receive said comparison signals and to produce a plurality of current pulses whose frequency is determined by said comparison signals, and a filter coupled to receive said current pulses and produce a dc output voltage whose magnitude is determined by said comparison signals, said filter having an input for receiving said current pulses, a MOS capacitor connected to said input, a transistor biased to operate as a resistor connected in series with said capacitor and to ground such that a series RC connection couples said input to ground, and an output connected to said capacitor.

9. An integrated circuit device comprising a logic device, a plurality of input pins connected to said logic device, a plurality of output pins connected to said logic device, and a timing apparatus for said logic device having an input connected to one of said input pins for receiving an input clock signal and an output connected to supply an output timing signal to said logic device, wherein both said logic device and said timing apparatus are completely formed on a common single chip, said timing apparatus comprising a phase locked loop arranged to produce said output timing signal whose frequency is a multiple of that of said received input clock signal, wherein said phase locked loop consists essentially of:

a comparator having a first input to which said received input clock signal is applied, a second input connected to the output of a divider arranged to divide the frequency of the output timing signal by a predetermined integer, and two outputs on which comparison signals are produced;

filter means coupled to receive current pulses derived from said comparison signals and to produce a dc output voltage whose magnitude is determined by said comparison signals; and a voltage controlled oscillator arranged to be controlled by said dc output voltage to produce said output timing signal, wherein said filter comprises an input for receiving said current pulses, a MOS capacitor connected to said input, a transistor biased to operate as a resistor connected in series with said capacitor and to ground such that a series RC connection couples said input to ground, and an output connected to said capacitor.

10. An integrated circuit device according to claim 9, wherein said filter means further comprises one or more transistor means connectible by way of programmable switches whereby the parameters of the filter may be varied.

11. An integrated circuit device according to claim 10, wherein said programmable switches comprise fuses.

12. An integrated circuit device according to claim 10, wherein said comparator is a phase and frequency comparator and is arranged to produce first and second comparison output signals indicating a difference in either phase or frequency between the input clock signal and the divided output timing signal and the direction of this difference.

13. An integrated circuit device according to claim 12, wherein said phase locked loop further includes a convertor arranged to receive said comparison signals and to produce a plurality of current pulses whose frequency is determined by said comparison signals, said filter means being coupled to receive said current pulses, and wherein said convertor comprises first and second current source transistors controlled by said comparison signals, and first and second current mirror transistors each corresponding to a respective one of said first and second current source transistors, each current mirror transistor being arranged to determine the magnitude of the current produced by its corresponding current source transistor.

14. An integrated circuit device according to claim 1 or 9 wherein said voltage controlled oscillator includes at least one capacitive circuit comprising a current source transistor coupled to a MOS capacitor.

15. An integrated circuit device comprising a logic device, a plurality of input pins connected to said logic device, a plurality of output pins connected to said logic device, and a timing apparatus for said logic device having an input connected to one of said input pins for receiving an input clock signal and an output connected to supply an output timing signal to said logic device, wherein both said logic device and said timing apparatus are completely formed on a common single chip, said timing apparatus comprising a phase locked loop arranged to produce said output timing signal whose frequency is a multiple of that of said received input clock signal, wherein said phase locked loop consists essentially of:
- a comparator having a first input to which said received input clock signal is applied, a second input connected to the output of a divider arranged to divide the frequency of the output timing signal by a predetermined integer, and two outputs on which comparison signals are produced;
- filter means coupled to receive pulses derived from said comparison signals and to produce a dc output voltage whose magnitude is determined by said comparison signals; and
- a voltage controlled oscillator arranged to be controlled by said dc output signal to produce said output timing signal, wherein said voltage controlled oscillator comprises an input to receive said dc output voltage, an output, and switchable means for producing oscillations at a frequency determined by the magnitude of said output voltage, said voltage controlled oscillator further including at least one capacitive circuit comprising a current source transistor coupled to a MOS capacitor.

16. An integrated circuit device according to claim 15 further comprising means for varying the time constant of said capacitive circuit whereby the center frequency of said voltage controlled oscillator may be varied.

17. An integrated circuit device according to claim 16 wherein said means for varying the time constant of the capacitive circuit includes at least one further MOS capacitor connected to said capacitive circuit by way of programmable switches.

18. An integrated circuit device according to claim 17 wherein said means for varying the time constant of the capacitive circuit includes one or more transistor means connectible in parallel with said current source transistor by programmable switches.

19. An integrated circuit device according to claim 17 or 18, wherein said programmable switches are fuses.

20. An integrated circuit device according to claim 15 wherein said switchable means of the voltage controlled oscillator comprises two switching transistors, the current path of each of said swiitching transistors being connected to a node, and a Schmitt trigger having an input connected to said node and an output forming the output of said voltage controlled oscillator, the output of said Schmitt trigger also being coupled to the gates of said switching transistors, and wherein said MOS capacitor is connected to said node,
said voltage controlled oscillator further comprising two current source transistors, each being connected to a respective one of said switching transistors, and two current mirror transistors, each current mirror transistor being connected to the input of the voltage controlled oscillator and to a respective one of said current source transistors such that the current flowing in each current source transistor is determined by the magnitude of said dc output voltage.

21. An integrated circuit device according to claim 15, wherein the switchable means of the voltage controlled oscillator comprises:
first and second pairs of switching transistors, the current paths of the two transistors in each pair being connected together at a node, and
two NAND gates, each NAND gate having first and second inputs and an output, the first input of each NAND gate being connected to the said node between a respective one of said pairs of switching transistors, and the second input of
each NAND gate being connected to the output of the other NAND gate, the output of each NAND gate also being connected to the gates of the transistors of the pair of switching transistors other than the pair to which its first input is connected,
the voltage controlled oscillator further comprising two MOS capacitors, each MOS capacitor being connected to the node of a respective pair of switching transistors, said current source transistor being coupled to each of said MOS capacitors by way of the respective pair of switching transistors, said current source transistor being connected to the input of the voltage controlled oscillator and to said pairs of switching transistors such that the current flowing in said switching transistors is determined by the magnitude of said dc output voltage.

22. An integrated circuit device as claimed in claim 15, wherein said logic device is a microcomputer.

23. A method of supplying timing signals to an integrated circuit logic device employing a timing apparatus formed together with the logic device on a common single chip, the method comprising the steps of:
applying a low frequency clock signal to an input of said timing apparatus, the timing apparatus being arranged to generate a high frequency timing signal at its output having a frequency which is a multiple of that of said clock signal,
dividing the frequency of said high frequency timing signal by a predetermined integer,
comparing the divided frequency with the frequency of the clock signal,
generating an increase or a decrease comparison signal where the clock signal frequency is respectively greater than or less than said divided frequency,
generating a dc voltage whose magnitude is determined by said comparison signals, and
generating said high frequency timing signal at the output of a voltage controlled oscillator controlled by said dc voltage, wherein said high frequency timing signal at the output of said voltage controlled oscillator is connected directly to said logic device to form the timing signal therefor.

24. A method according to claim 23 further comprising determining the operating speed of said logic device, and selecting said predetermined integer by which said high frequency timing signal is divided such that the frequency of said high frequency timing signal is matched to the said operating speed.

* * * * *